United States Patent
Hug et al.

(10) Patent No.: US 7,873,335 B2
(45) Date of Patent: Jan. 18, 2011

(54) CURRENT LIMITING CIRCUIT FOR RF POWER AMPLIFIER

(75) Inventors: John J. Hug, Haarlem (NL); Dmitri P. Prikhodko, Wijchen (NL); Adrianus Van Bezooijen, Molenhoek (NL)

(73) Assignee: NXP B.V., Eindhoven (NL)

( * ) Notice: Subject to any disclaimer, the term of this patent is extended or adjusted under 35 U.S.C. 154(b) by 350 days.

(21) Appl. No.: 11/720,321

(22) PCT Filed: Nov. 23, 2005

(86) PCT No.: PCT/IB2005/053884
§ 371 (c)(1), (2), (4) Date: Dec. 2, 2008

(87) PCT Pub. No.: WO2006/056952
PCT Pub. Date: Jun. 1, 2006

(65) Prior Publication Data
US 2009/0170454 A1 Jul. 2, 2009

(30) Foreign Application Priority Data
Nov. 29, 2004 (EP) .................. 04106137

(51) Int. Cl.
H04B 1/04 (2006.01)
(52) U.S. Cl. .................. 455/127.1; 455/126; 455/115.1
(58) Field of Classification Search ... 455/127.1–127.5, 455/126, 115.1, 115.2
See application file for complete search history.

(56) References Cited

U.S. PATENT DOCUMENTS

| | | | |
|---|---|---|---|
| 5,748,037 A * | 5/1998 | Rozental et al. | 455/115.2 |
| 6,178,313 B1 | 1/2001 | Mages et al. | |
| 6,430,402 B1 * | 8/2002 | Agahi-Kesheh | 455/115.3 |
| 6,476,677 B1 * | 11/2002 | Komaili et al. | 330/279 |
| 6,665,525 B2 * | 12/2003 | Dent et al. | 455/108 |
| 6,701,138 B2 | 3/2004 | Epperson et al. | |
| 7,433,658 B1 * | 10/2008 | Shirvani-Mahdavi et al. | 455/127.2 |
| 2004/0228179 A1 * | 11/2004 | Pagliato et al. | 455/127.2 |
| 2005/0206447 A1 * | 9/2005 | Yamazaki et al. | 330/129 |

* cited by examiner

Primary Examiner—Lana N Le

(57) ABSTRACT

A current limiting circuit, especially for an RF power amplifier (PA) having a power control loop. The circuit is adapted to sense a representation of a bias current fed to a final stage of the PA. The sensed representation of the bias current is compared to a predetermined reference current and a signal is fed back to the power control loop upon the sensed representation of the bias current exceeding the reference current so as to limit output current of the PA. This provides a limitation of a current drawn by the PA which is generally insensitive to supply voltage and temperature variations. Optionally, a second circuit may be added to limit current drawn by the PA. The second circuit comprising a high accuracy VI converter that is adapted to compare a voltage VLIM representing a feed-back voltage of the power control loop and a predetermined reference voltage VBGAP. The circuit is operatively connected to the VI converter so as to reduce the output current Iout upon the voltage VLIM representing the feed-back voltage exceeding the predetermined reference voltage VBGAP. Under antenna mismatch conditions both circuits help to limit a supply current drawn by the PA compared to prior art power control loops that are unable to detect and limit a high current draw under mismatch conditions.

7 Claims, 4 Drawing Sheets

CURRENT LIMITING CIRCUIT FOR RF POWER AMPLIFIER

Figure 1:
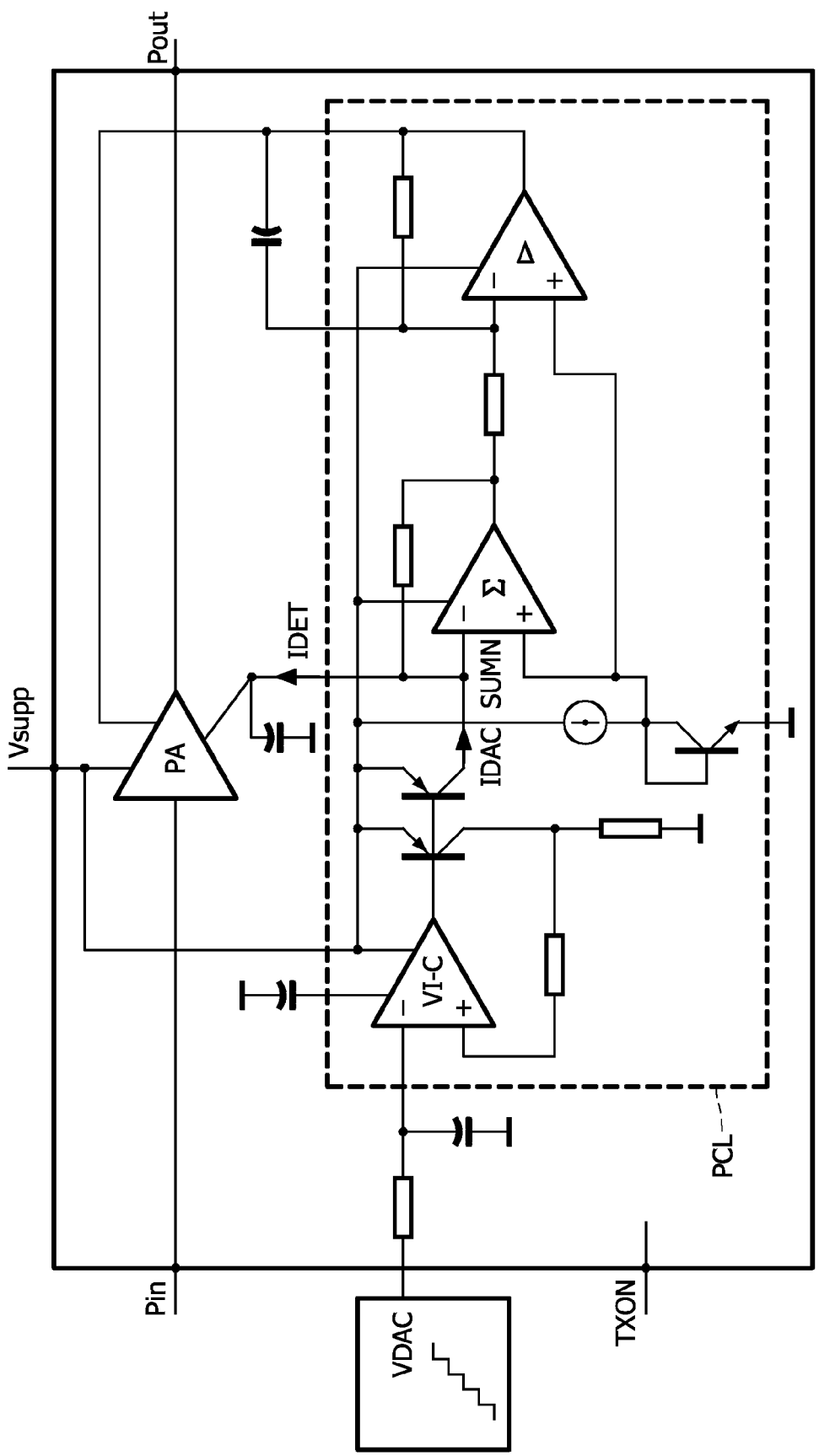

The invention relates to the field of circuits for limiting supply current drawn by an RF power amplifier. More specifically the invention relates to circuits for current limitation of Radio Frequency (RF) power amplifiers (PA) during antenna mismatch conditions. The invention is especially suited for power amplifiers with a built-in power control loop.

RF power amplifier output stages, such as GSM PAs, are vulnerable to antenna mismatch conditions. During antenna mismatch, depending on the phase, collector current of the RF output stage can increase significantly. Such a high collector current causes a large power consumption which is critical in terms of battery discharge, for example in a GSM mobile phone. Under extreme conditions, the collector current may be high enough to irreparable damage the PA.

PAs with a built-in power control loop (using either a coupler/detector combination, a current mirror, or a resister in the supply line to sense output power) do not in themselves provide an accurate and efficient way to measure power dissipation under mismatch. A power control loop using a coupler/detector combination detects forward power only. This does not provide enough information to calculate dissipated power.

The accuracy of a current mirror depends on how well it, and all of the voltages and currents on its terminals, are scaled representations when compared with those properties of the RF stage. As the current mirror device inevitably "sees" a different load impedance than the scaled version of that presented to the RF stage (particularly under mismatch), inaccuracies are inevitable. An accurate sense of the dissipation of the final stage can be accomplished with a resistance in the supply line, but this costs power added efficiency.

Examples of prior art power limitation of PAs can be found in U.S. Pat. No. 6,701,138 and U.S. Pat. No. 6,178,313. Both of these US patents describe different power controls for mobile phones. Such power controls are able to limit power delivered by a PA during normal working conditions, e.g. with a normal 50 Ohm or close to 50 Ohm load impedance of the PA. However, under antenna mismatch conditions the PA itself becomes significantly less efficient and therefore draws considerably more power from the supply thus causing battery discharge and possibly self-destruction.

It may be seen as an object of the present invention to provide a current limitation circuit that is capable of providing an accurate sensing and limiting of supply current of a PA, especially a RF PA with a power control loop, under mismatch conditions. The current limitation circuit should not itself lead to a reduced power efficiency.

According to a first aspect the invention provides a circuit for limitation of a supply current for an associated power control looped power amplifier, the circuit comprising means adapted to sense a current representing a bias current fed to an output stage of the associated power amplifier, and to compare the sensed current and a predetermined reference current, and means adapted to apply a signal to the power control loop of the associated power amplifier upon the sensed current exceeding the predetermined reference current so as to limit an internal control voltage of the power control loop thus limiting output power of the power amplifier.

With a measure of output current based on detecting bias current fed to the final amplifier stage of the PA, a good estimate of the output current drawn is achieved. Thus, by properly selecting the predetermined reference current, it is possible to predefine a maximum output current which is generally independent of supply voltage and temperature variations. Thus, the circuit is capable of providing a high security of detecting and limiting conditions with a high output current of the PA, also under mismatch conditions. Hereby, the circuit helps to save supply power and prevent damage of the PA under mismatch conditions.

The circuit according to the first aspect is easily integrated with the power control loop of the amplifier.

The means adapted to apply the signal to the power control loop may comprise a current mirror operatively connected to compare the sensed current and the predetermined reference current, such as a current mirror based on two bipolar junction transistors.

Preferably, the means adapted to sense the current representing the bias current is adapted to sense a scaled version of the bias current fed to the output stage.

The circuit may comprise a current generator adapted to generate the predetermined reference current. Preferably, such current generator provides a stable current generally insensitive to supply voltage and temperature variations.

Preferably, the signal applied to the power control loop is applied to an interface scaling block of the power control loop.

Optionally, the circuit further comprises a second current limitation circuit comprising:

a VI converter adapted to generate an output current in response to an input voltage and a feed-back voltage representing the output current, the output current being generated by an output stage, and a current limitation circuit comprising means adapted to compare a voltage representing the feed-back voltage and a predetermined reference voltage, the current limitation circuit being operatively connected to the output stage of the VI converter so as to reduce the output current upon the voltage representing said feed-back voltage exceeding the reference voltage.

The second optional circuit provides a high accuracy VI converter that is capable of providing an accurate and well-defined maximum output current that is determined by properly selecting the predetermined reference voltage using a stable voltage generator. As the VI-current is compared with the output power detector current in the power control loop, a stable maximum VI-current value is necessary to force a stable maximum detector current, a stable maximum output power, and a stable maximum supply current.

Since the well-defined maximum output current is highly independent of variations in supply voltage and temperature, the circuit serves to provide a well-defined current limitation also under antenna mismatch conditions.

Thus, the circuit is capable of detecting and limiting output of the PA under mismatch conditions and hereby, the circuit will save supply power. In addition, it will prevent permanent damage of the PA due to a high current drawn under mismatch conditions. As such it may be seen as providing a further security of detecting a high current drawn by the PA under mismatch conditions and thus supplements the first circuit.

As the first circuit, the additional second circuit may easily be integrated into the power control loop of the PA.

Preferably, the second current limitation circuit comprises a differential pair adapted to compare the voltage representing the feed-back voltage and the predetermined reference voltage.

The circuit may comprise a voltage generator adapted to generate the predetermined reference voltage. Preferably, such optional voltage generator is adapted to provide a stable reference voltage that is insensitive to variations in supply voltage variations and temperature.

The predetermined reference voltage is selected so as to provide a predetermined maximum output current. The reference voltage defines together with the sensed voltage representing the feed-back voltage an output current threshold above which the output current will be limited. Thus, the reference voltage must be predetermined together with the sensed voltage representing the feed-back voltage to provide a desired maximum output current.

In a second aspect the invention provides a method of controlling output current of a power amplifier comprising a power control loop, the method comprising the steps of:

sensing a current representing a bias current of an output stage of the output stage of the power amplifier, comparing the current representing the bias current and predetermined reference current applying a signal to the power control loop of the associated power amplifier upon the sensed current exceeding the predetermined reference current so as to limit an internal control voltage of the power control loop thus limiting output power of the power amplifier.

In a third aspect the invention provides an RF power amplifier comprising a power control loop and a supply current limitation circuit according to the first aspect. A preferred embodiment of the RF power amplifier comprises both the first and second circuits described in connection with the first aspect.

In a fourth aspect the invention provides a mobile communication device comprising an RF power amplifier according to the third aspect. The mobile device may be a GSM mobile phone.

Figure 2:
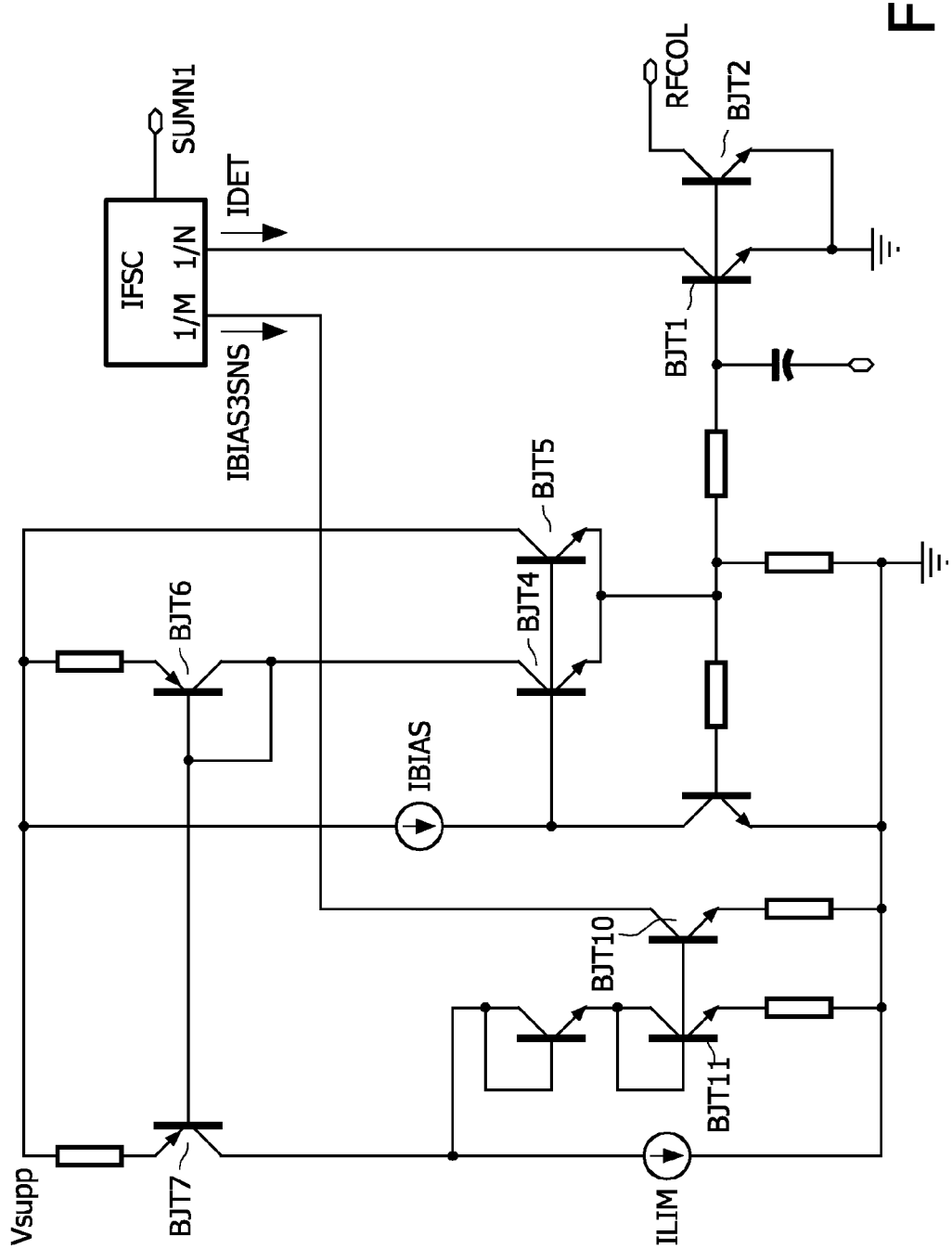
Figure 3:
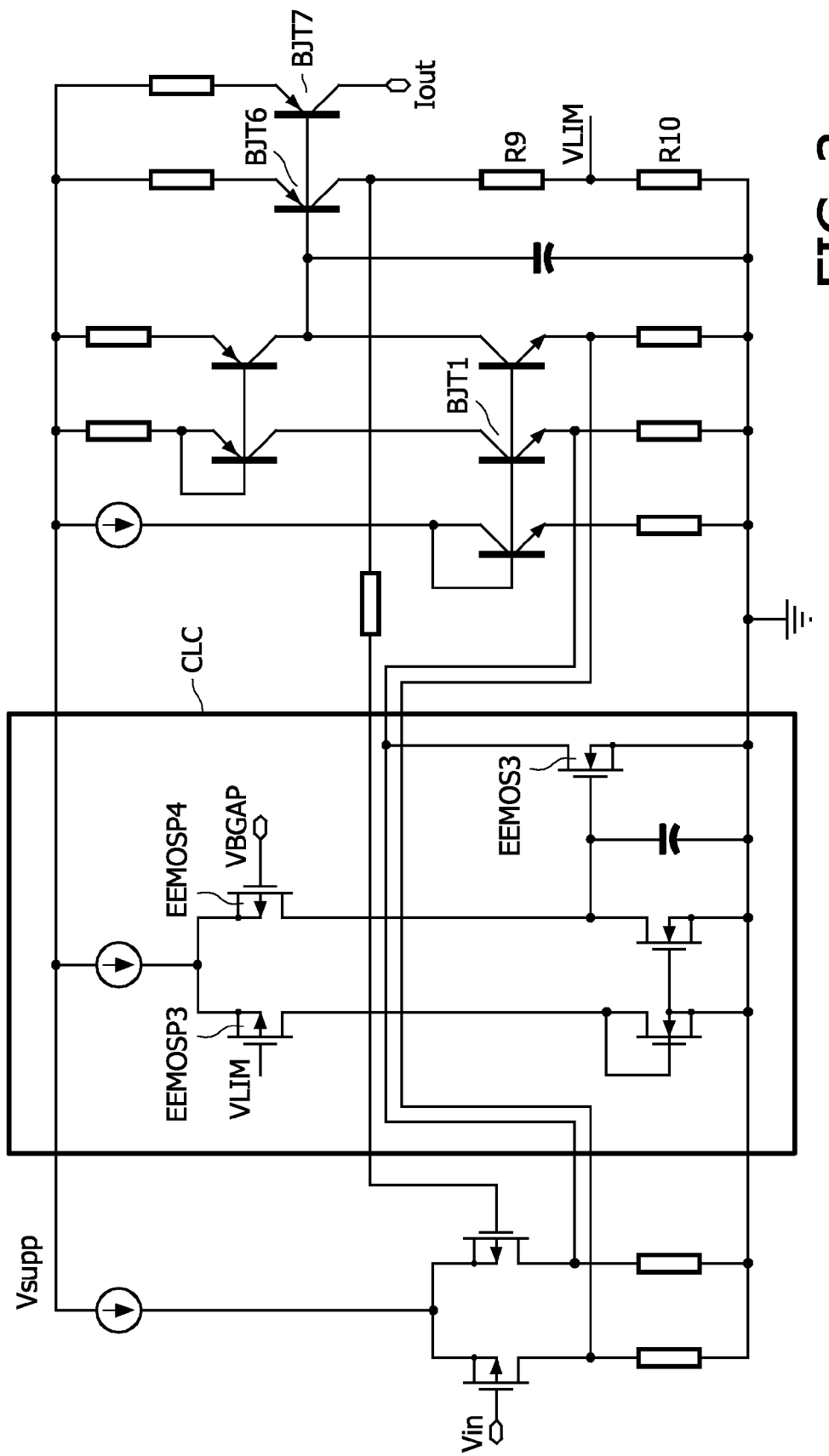
Figure 4:
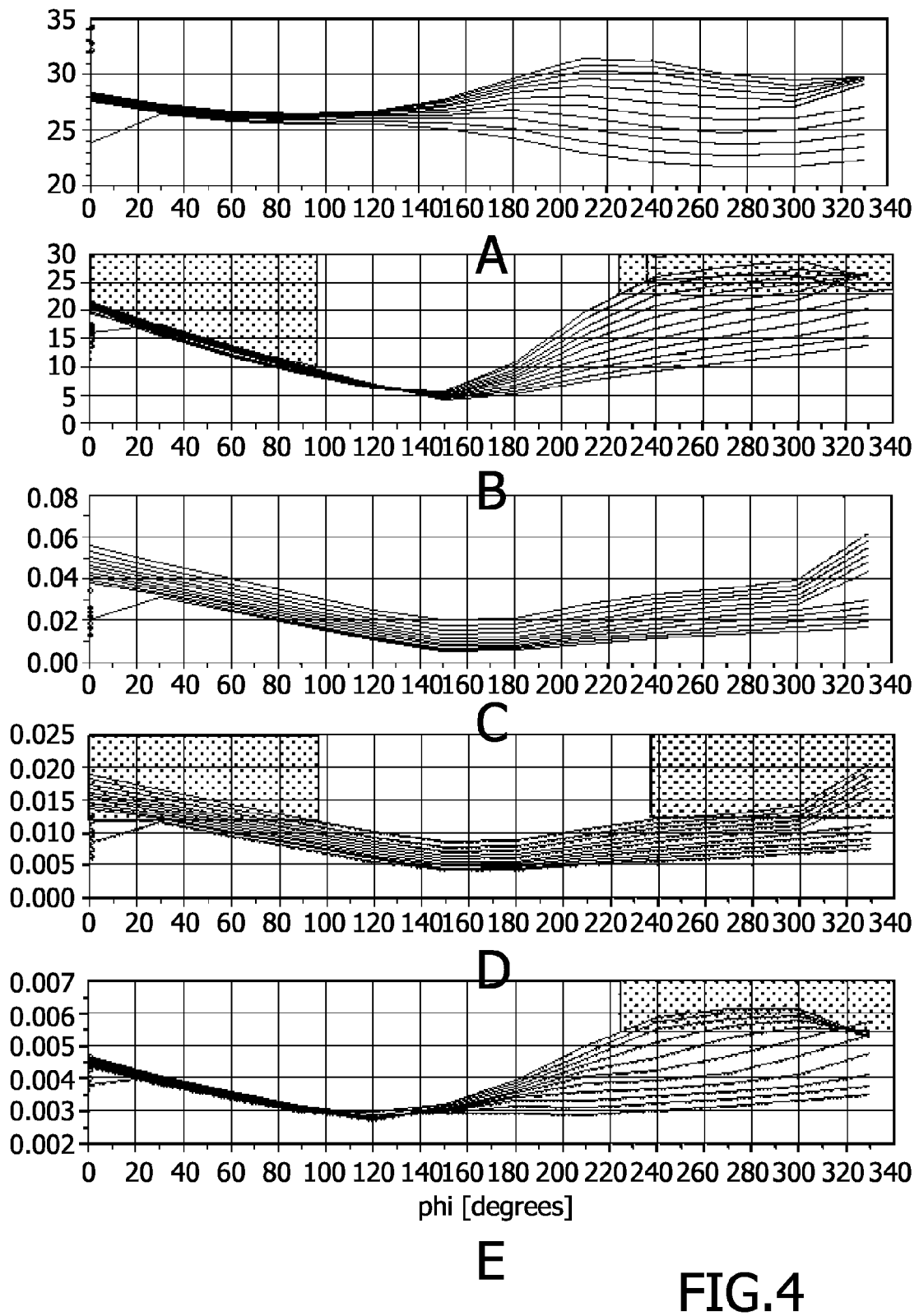

In the following the invention is described in more details with reference to the accompanying Figures of which, FIG. 1 illustrates a diagram of a prior art GSM PA with a power control loop, FIG. 2 illustrates a diagram of a preferred current limitation circuit embodiment of a first aspect of the invention, FIG. 3 illustrates an optional current limitation circuit according to the invention, VI converter performance of a prior art GSM PA depending on supply voltages and temperatures, FIG. 4 illustrates current limitation performance of both current limitation circuits of FIGS. 2 and 3.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

FIG. 1 illustrates a diagram of a prior art implementation of a GSM PA with a power control loop. It is clear from the FIG. 1 that the accuracy of the VI converter VI-C over variations in temperature, supply voltage, etc. is critical as it is outside the loop. A particularly critical element is the stability of the maximum output current of the VI converter VI-C.

FIG. 2 shows a preferred current limiting circuit according to the invention. The circuit of FIG. 2 is adapted to limit a current drawn by a PA based on sensing a bias current drawn by an output stage of the PA. The circuit of FIG. 2 is intended to have its terminal SUMN1 connected to the summation node SUMN of the prior art circuit of FIG. 1. Terminal RFIN is intended to be connected to an input of the final stage of the PA, while terminal RFCOL is intended to be connected to the final PA stage collector.

As the final stage of a GSM PA is often operating between class B and class C, the base current is allowed to increase as required to reach the desired output power. Sensing this current gives a good indication of collector current of the final stage. This sensed current can then be compared with a fixed reference current. When the reference current is exceeded (i.e. the collector current of the final stage exceeds a specified value), a signal can be fed to the power control loop PCL to limit the internal control voltage, this limits the DC supply current as well as the output power of the PA.

In the circuit of FIG. 2 the base current of the RF final stage BJT2, being a factor 100 or so larger than the RF detector BJT1 and, therefore, dominant, is supplied by the Beta compensation transistor BJT4. A portion of this current is sensed using BJT5. Using a current mirror realized by BJT6 and BJT7, this current can be compared with the fixed reference, ILIM. If ILIM is exceeded, the excess current is fed through the current mirror BJT11, BJT10 to the interface block IFSC of the power control loop. In the interface block IFSC the proper scaling can be accomplished before IBIAS3SNS (along with the RF detector current IDET) can be fed to the summation node SUMN of the power control loop PCL. In the interface block IFSC the constants N and M imply that, prior to being fed to the summation node SUMN, the currents IDET and IBIAS3SNS are scaled to an appropriate level, e.g. using simple current mirrors.

Proper scaling of IBIAS3SNS is critical as it determines the accuracy of the DC supply current limit (through the loop gain), as well as the loop stability. Consider the following: at the summation node SUMN, IDAC=IDET/N+IBIAS3SNSN/M. Imagining that ILIM is exceeded at a given IDAC, it is desired that the DC supply current is limited to its value at that point, i.e. it is desired not to have a corresponding increase in DC supply current (or output power), if IDAC is further increased. In order to achieve this it is needed that IDET/N+IBIAS3SNSN/Mincreases significantly as a function of the DC supply current (or output power). However, the rate of increase of IDET as a function of output power (i.e. detector sensitivity) is limited for reasons of "detector loop" stability.

Considering a design example, $A_{BJT2}/A_{BJT1}$, the scaling of the RF final stage with respect to the RF detector will typically be of the order of 100. $\beta_{FINALSTAGE}$ is of the order of 50 when the final stage is being over driven. As simulations of the base current indicate a maximum value of around 30 mA, and values suitable for practical mirroring are on the order of 1 mA, $A_{BJT5}/(A_{BJT5}+A_{BJT4}) \cong 1/31$ is chosen. This yields $(1/31)(1/50)(100/1)(1/M)=2/M$, and hence $N/M \cong 32$ as a maximum. Thus, in a preferred design a value of N/M is chosen to be adjustable between 16 and 32 in order to provide a stability being on the safe side.

A behavioral model has been used to approximate the closed loop PA behavior of with the second circuit present. For the purposes of simulation, the current limiting circuitry is set to begin its action at about 28.5 dBm. In the actual circuit the limit is preferably set higher, as the specification for a GSM PA requires that it delivers about 33 dBm. However, setting the limit lower improves visualization of the current limiting circuit function in a qualitative way. The actual decrease in DC supply current is not known, though. Nevertheless the limiting action of the second circuit can qualitatively by described by monitoring the output power. The results of a loop stability simulation of the preferred embodiment of the second circuit has resulted in a phase margin of 36 degrees which may be considered just acceptable even though a slightly higher value may be desired in order to be on the safe side.

FIG. 3 shows an additional preferred circuit to supplement the circuit of FIG. 2, namely a high accuracy VI converter circuit. With the additional high accuracy VI converter circuit of FIG. 3 it is possible to further limit DC current drawn by a PA and thus protect the PA against damage under extreme load mismatch conditions and save power under non-extreme mismatch conditions.

The VI converter VI-C from FIG. 1 comprises an operational amplifier driving two PNP devices BJT6 and BJT7. The collector of BJT6 is fed to a temperature-stabilized resistor R9, R10, creating a voltage that is fed back to the positive terminal of the op-amp. BJT7 is a mirror of BJT6. In this way, Vin (at the negative terminal of the op-amp) determines the output current. The stability over variations in temperature and supply voltage mostly depends on the gain of the op-amp (as well as the temperature stability of R9 and R10). However, as the supply voltage changes, the maximum Iout (reached when |Vin-Vsupp|<|Vthreshold|) changes as well. However, according to the invention, if the maximum output current of the VI converter VI-C remains stable, it can be used to accurately limit the detector current and, thus, the supply current of the PA—assuming the detector current is an accurate representation thereof.

The circuitry contained in the Current Limiting Circuit CLC box is implemented to prevent the mentioned current deviation from occurring. According to the invention, if the maximum output current of the VI converter VI-C of FIG. 1 remains stable, it can be used to accurately limit the detector current and, thus, the supply current of the PA—assuming the detector current is an accurate representation thereof. The circuit of FIG. 3 provides such VI converter with a stable maximum output current.

In the circuit of FIG. 3 a scaled version of the fed-back voltage VLIM is compared with a stable voltage source VBGAP. If VLIM rises above VBGAP, the differential pair EEMOS1P3, EEMOS1P4 causes EEMOS3 to pull current from BJT1. This has the effect of limiting Iout to that value which keeps VLIM equal to VBGAP. Thus, an accurate limitation of Iout is obtained.

Thus, with the preferred high accuracy VI converter circuit of FIG. 3 it is possible to further limit DC current drawn by a PA and thus protect the PA against damage under extreme load mismatch conditions and save power under non-extreme mismatch conditions.

FIG. 4 shows graphs A, B, C, D and E illustrating qualitatively the impact on the DC supply current under mismatch of the bias current limiting circuit and of the high-accuracy VI-converter. The graphs A-E in FIG. 4 are based on simulations using a model of the final stage (as well as its associated bias circuit). As the current draw of the final stage will, inevitably, dominate the total DC supply current at high output powers, such simulation is expected to provide a good estimate of the overall DC supply current limitation.

Sweeping a 6:1 load mismatch through all phases, it is possible to simulate the change in output power, collector current, base current, sensed base current (approximately $\frac{1}{30}^{th}$ the value of the base current, as described above), and detector current as a function of mismatch phase phi.

Assuming that the high-accuracy VI-converter limits the DAC current to 5.5 mA, the power control loop is expected to act to limit the detector current to this value as well. After noting which collector currents occur when the value of the detector currents increases above 5.5 mA, they can be excluded. The reason is that when the power control loop (or, more specifically, the "detector loop") and the high-accuracy VI-converter are properly functioning, these collector currents should never be reached.

It can also be assumed that the bias current limiting circuitry will limit the bias sense current to the value of ILIMIT (which is chosen to be higher than the highest bias sense current necessary to achieve the specified maximum output power under all operating conditions with a 50 ohm load—in this case 1.25 mA). After noting which collector currents occur when the values of the bias sense current are above 1.25 mA, they can be excluded. The reason is that when the "bias 3 loop" and bias limiting circuitry are properly functioning, these collector currents should never be reached.

The graphs of FIG. 4 illustrate results obtained for a low-band (900 MHz) example. The graphs shown are: detector current E, bias sense current D, bias current C, collector current B, and output power A; all versus phi (mismatch phase) with a mismatch magnitude of 6:1.

A simulation of the final stage operating under nominal (50 ohm) conditions is first carried out for reference and shown in graph A. The results of this simulation are indicated by the dots on the left-hand side of each plot (simulations are carried out for several output powers). The simulation is then repeated for a 6:1 mismatch, all phases (again for several output powers), the results being indicated by the lines. In the graph E, detector current vs. phi, the area where the detector current exceeds 5.5 mA is highlighted with a box. By noting where each line crosses this box, and marking it in the collector current vs. phi plot, a box can also be drawn over a section of the latter curves. This represents the collector currents that the high accuracy VI-converter will prevent the PA from drawing.

In the graph D, bias sense current vs. phi, a box indicates where the bias sense current exceeds the specified ILIM of 1.25 mA. By noting where each line crosses this box, and marking it in the collector current vs. phi plot, a box can also be drawn over a section of the latter curves. This represents the collector currents that the bias current limit circuitry will prevent the PA from drawing.

Similar results have been calculated for a high-band (1880 MHz) operation example.

In the claims reference signs to the Figures are included for clarity reasons only. These references to exemplary embodiments in the Figures should not in any way be construed as limiting the scope of the claims.

The invention claimed is:

1. Circuit for limitation of a supply current for an associated power control looped power amplifier, the circuit comprising:
    means adapted to sense a current representing a bias current fed to an output stage of the associated power amplifier, and to compare the sensed current and a predetermined reference current,
    means adapted to apply a signal to the power control loop of the associated power amplifier upon the sensed current exceeding the predetermined reference current so as to limit an internal control voltage of the power control loop thus limiting output power of the power amplifier; and
    a second current limitation circuit comprising:
    a VI converter adapted to generate an output current in response to an input voltage and a feed-back voltage representing the output current, the output current being generated by an output stage, and
    a current limitation circuit comprising means adapted to compare a voltage representing the feed-back voltage and a predetermined reference voltage, the current limitation circuit being operatively connected to the output stage of the VI converter so as to reduce the output current upon the voltage representing said feed-back voltage exceeding the reference voltage.

2. Circuit according to claim 1, wherein the means adapted to apply the signal to the power control loop comprises a current mirror operatively connected to compare the sensed current and the predetermined reference current.

3. Circuit according to claim 1, wherein the means adapted to sense the current representing the bias current is adapted to sense a scaled version of the bias current fed to the output stage.

4. Circuit according to claim 1, comprising a current generator adapted to generate the predetermined reference current.

5. Circuit according to claim 1, wherein the signal applied to the power control loop is applied to an interface scaling block of the power control loop.

6. RF power amplifier comprising a power control loop and a supply current limitation circuit according to claim 1.

7. Mobile communication device comprising an RF power amplifier according to claim 6.

* * * * *